(12) United States Patent
Hsu

(10) Patent No.: US 8,378,363 B2
(45) Date of Patent: Feb. 19, 2013

(54) SELF-ILLUMINATING DISPLAY HAVING LIGHT EMITTING NANOWIRES AND METHOD FOR MAKING SAME

(75) Inventor: Chia-Ling Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 132 days.

(21) Appl. No.: 13/074,022

(22) Filed: Mar. 29, 2011

(65) Prior Publication Data

US 2012/0153319 A1 Jun. 21, 2012

(51) Int. Cl.
*H01L 21/00* (2006.01)
*H01L 29/20* (2006.01)

(52) U.S. Cl. .................. 257/89; 257/E33.065; 977/762; 977/952; 438/34

(58) Field of Classification Search .................... 438/34; 257/89, E33.065; 977/762, 952
See application file for complete search history.

(56) References Cited

U.S. PATENT DOCUMENTS

| 2006/0121602 | A1* | 6/2006 | Hoshizaki et al. | 435/288.7 |
|---|---|---|---|---|
| 2007/0012980 | A1* | 1/2007 | Duan et al. | 257/296 |
| 2007/0228421 | A1* | 10/2007 | Shioya et al. | 257/213 |
| 2008/0224123 | A1* | 9/2008 | Martin et al. | 257/23 |
| 2008/0233675 | A1* | 9/2008 | Lee et al. | 438/104 |
| 2008/0280069 | A1* | 11/2008 | Parce et al. | 427/580 |
| 2009/0242405 | A1* | 10/2009 | Mayer et al. | 204/435 |
| 2010/0261013 | A1* | 10/2010 | Duan et al. | 428/384 |

* cited by examiner

*Primary Examiner* — Kevin Parendo
(74) *Attorney, Agent, or Firm* — Altis Law Group, Inc.

(57) ABSTRACT

A self-illuminating display includes a substrate, and a number of light emitting units. The light emitting units are formed on the substrate in an array fashion. Each of the light emitting units includes a first electrode, a second electrode formed on the substrate and a number of light emitting nanowires. The first electrode includes a number of first arms, and the second electrode includes a number of second arms. Each of the first arms opposes a corresponding second arm. Each of light emitting nanowires interconnects the first arm and the corresponding second arm. Each of the light emitting nanowires has a p-n junction.

20 Claims, 11 Drawing Sheets

SELF-ILLUMINATING DISPLAY HAVING LIGHT EMITTING NANOWIRES AND METHOD FOR MAKING SAME

BACKGROUND

1. Technical Field

The present disclosure relates to self-illuminating displays and methods for making the same.

2. Description of Related Art

Liquid crystal displays are widely used in various fields. One disadvantage of the liquid crystal display is that the liquid crystal display needs a backlight unit to provide illumination for liquid crystals, which may cause the liquid crystal display to be bulky.

Therefore, a self-illuminating display and a method for making the same, which can overcome the limitations described, is needed.

DETAILED DESCRIPTION

Figure 1:
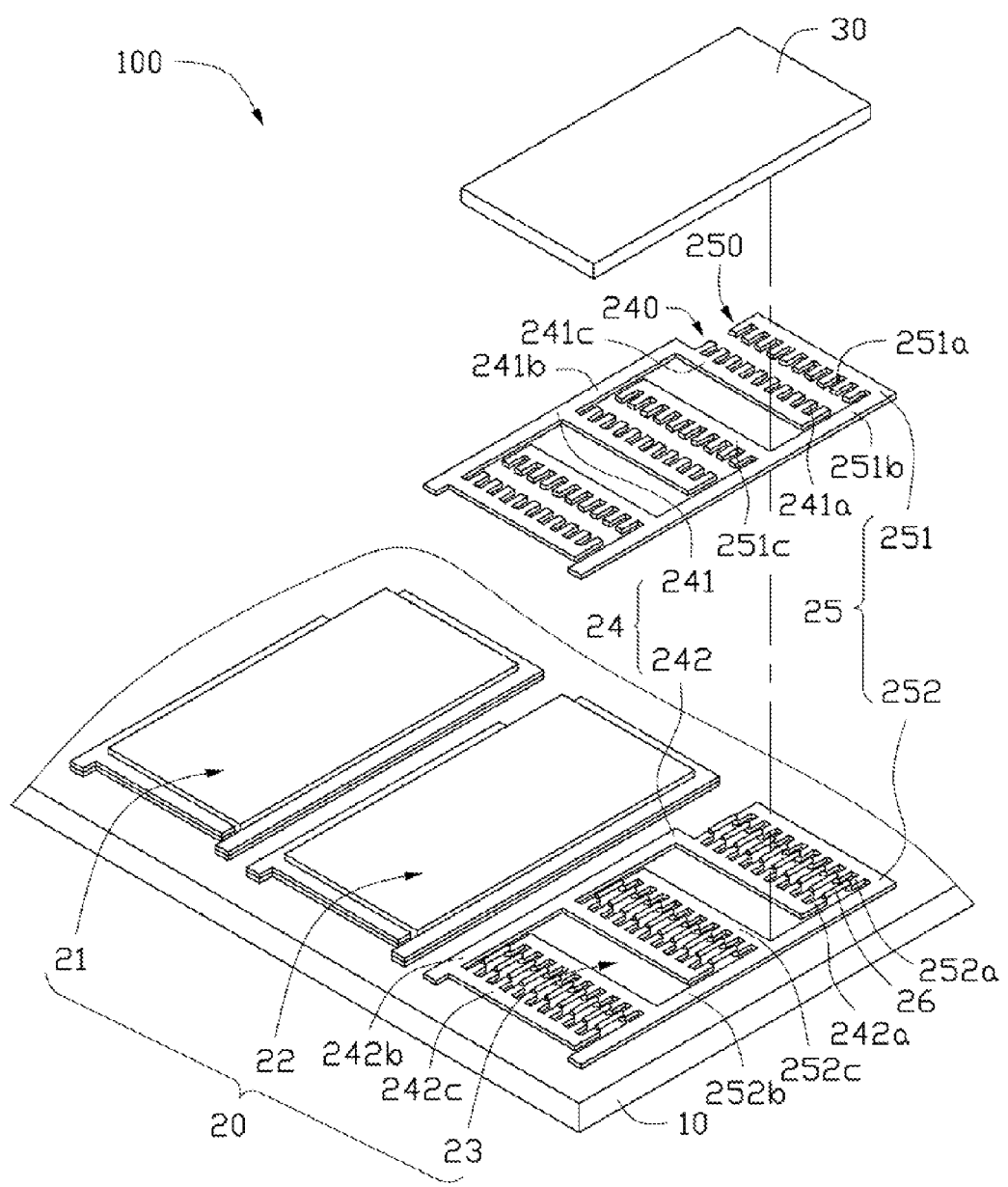
FIG. 1 is a schematic view of a self-illuminating display, according to a first embodiment.
Figure 2:
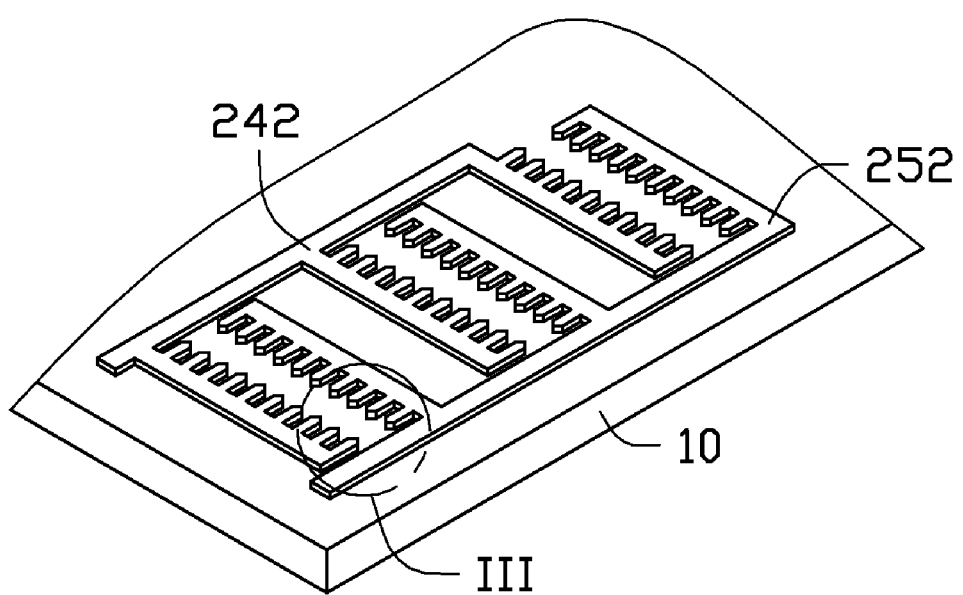
FIG. 2 to FIG. 6 are schematic views of successive stages of a method for making a self-illuminating display, according to a second embodiment.

Referring to FIG. 1, a self-illuminating display 100, according to a first embodiment, includes a substrate 10, a number of light emitting units 20 and a number of covers 30. The light emitting units 20 are arranged on the substrate 10 in an array fashion.

The substrate 10 is transparent and may be a polyethylene terephthalate (PET) substrate.

In this embodiment, the light emitting units 20 includes three-color light emitting units 21, 22 and 23 for emitting red, green, and blue light, respectively. The light emitting unit 21 (hereinafter the red light emitting unit 21) emits red light, the light emitting unit 22 (hereinafter the green light emitting unit 22) emits green light and the light emitting unit 23 (hereinafter the blue light emitting unit 23) emits blue light. Each light emitting unit includes a first electrode 24, a second electrode 25 and a number of semiconductor light emitting nanowires 26. Combination of the adjacent the red light emitting unit 21, the green light emitting unit 22 and the blue light emitting unit 23 may be serve as a display pixel of the display. Therefore, no additional backlight is needed and the display 100 can be minimized.

The first electrode 24 and the second electrode 25 are transparent and are arranged on the substrate 10. The first electrode 24 opposes the second electrode 25. Each semiconductor light emitting nanowire 26 has a p-n junction and interconnects the first electrode 24 and the second electrode 25. When electrified via the first electrode 24 and the second electrode 25, the light emitting nanowire 26 can emit light. In this embodiment, the nanowire 26 of the red light emitting unit 21 is comprised of GaP, the nanowire 26 of the green light emitting unit 22 is comprised of InGaAlP, and the nanowire 26 of the blue light emitting unit 23 is comprised of GaN. In alternative embodiments, each light emitting unit 20 may include one or two or more light emitting units rather than three light emitting units, depending on a practical usage, and light emitting material of the light emitting nanowire 26 may differ.

In this embodiment, the first electrode 24 includes a first lower sub electrode 242 and a first upper sub electrode 241 formed on the first lower sub electrode 242. The first upper sub electrode 241 includes a first upper sub horizontal beam 241b, a number of parallel first upper sub vertical beams 241c substantially perpendicular to the first upper sub horizontal beam 241b, and a number of parallel first upper arms 241a arranged along a lengthwise direction of each of the first upper sub vertical beams 241c, and each extending alone a same first direction from each of the first upper sub vertical beams 241c; and the first lower sub electrode 242 includes a first lower sub horizontal beam 242b, a plurality of parallel first lower sub vertical beams 242c substantially perpendicular to the first lower sub horizontal beam 242b, and a number of parallel first lower arms 242a arranged along a lengthwise direction of each of the first lower sub vertical beams 242c, and each extending alone the same first direction from each of the first lower sub vertical beams 242c. The second electrode 25 includes a second lower sub electrode 252 and a second upper sub electrode 251 formed on the second lower sub electrode 252. The second upper sub electrode 251 includes a second upper sub horizontal beam 251b, a plurality of parallel second upper sub vertical beams 251c substantially perpendicular to the second upper sub horizontal beam 251b, and a number of parallel second upper arms 251a arranged along a lengthwise direction of each of the second upper sub vertical beams 251c, and each extending along a same second direction from each of the second upper sub vertical beams 251c, the second direction being opposite to the first direction; and the second lower sub electrode 252 includes a second lower sub horizontal beam 252b, a plurality of parallel second lower sub vertical beams 252c substantially perpendicular to the second lower sub horizontal beam 252b, and a number of parallel second lower arms 252a arranged along a lengthwise direction of each of the second lower sub vertical beams 252c, and each extending along the same second direction from each of the second lower sub vertical beams 252c. The first upper arm 241a and the corresponding first lower arm 242a form a first arm 240, and the second upper arm 251a and the corresponding second lower arm 252a form a second arm 250.

Figure 3:
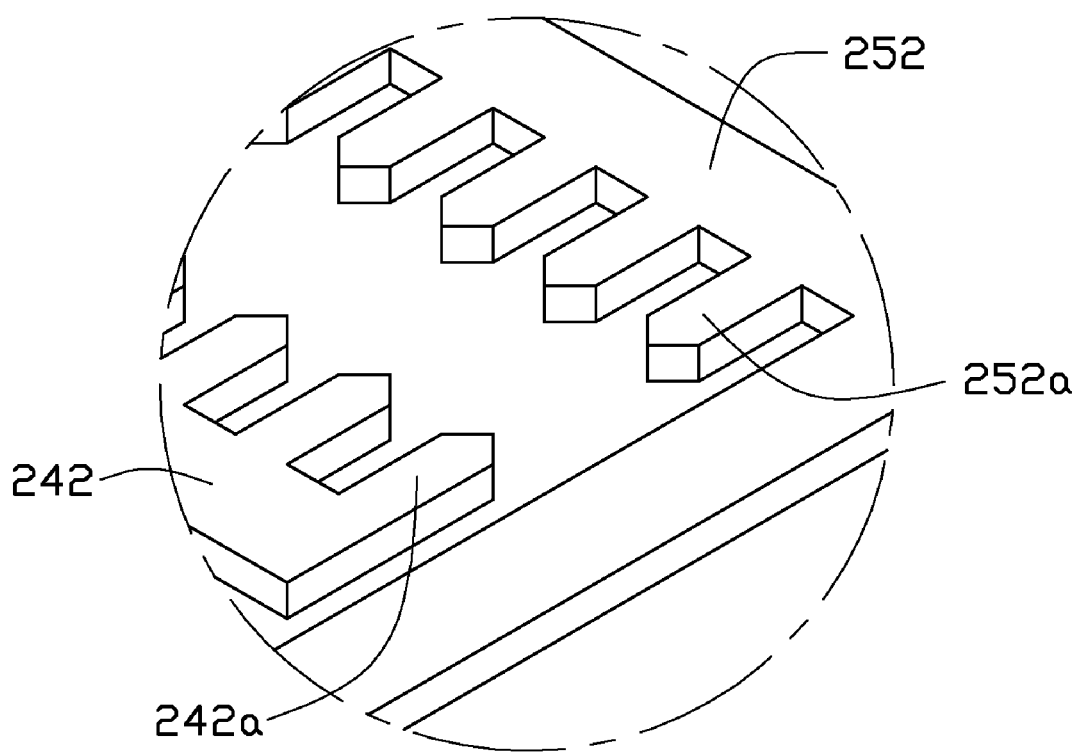
Figure 4:
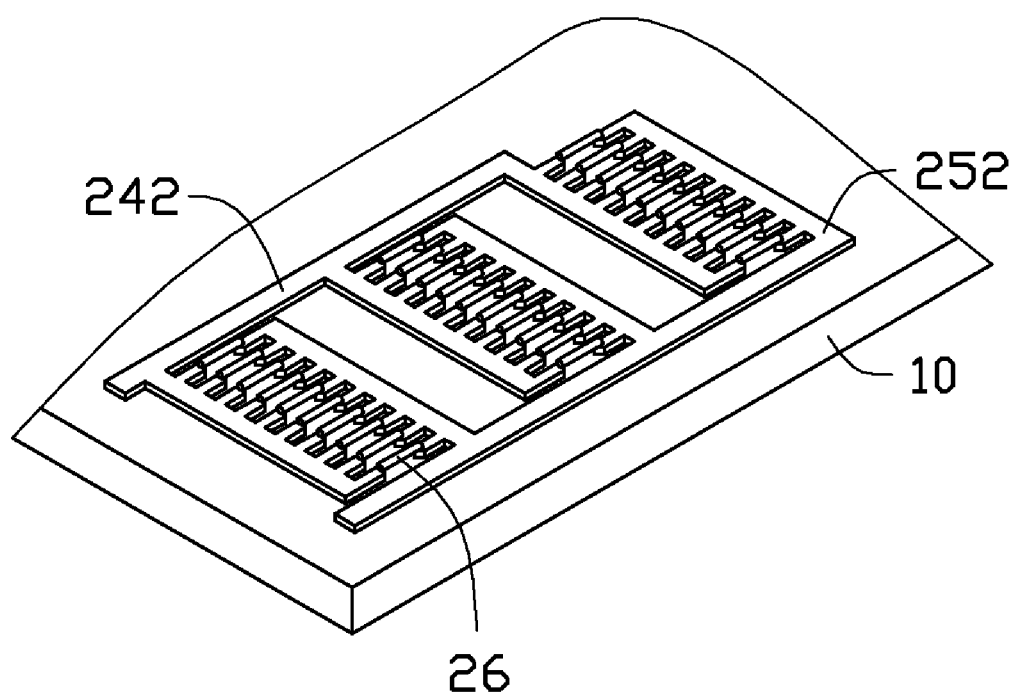
Figure 5:
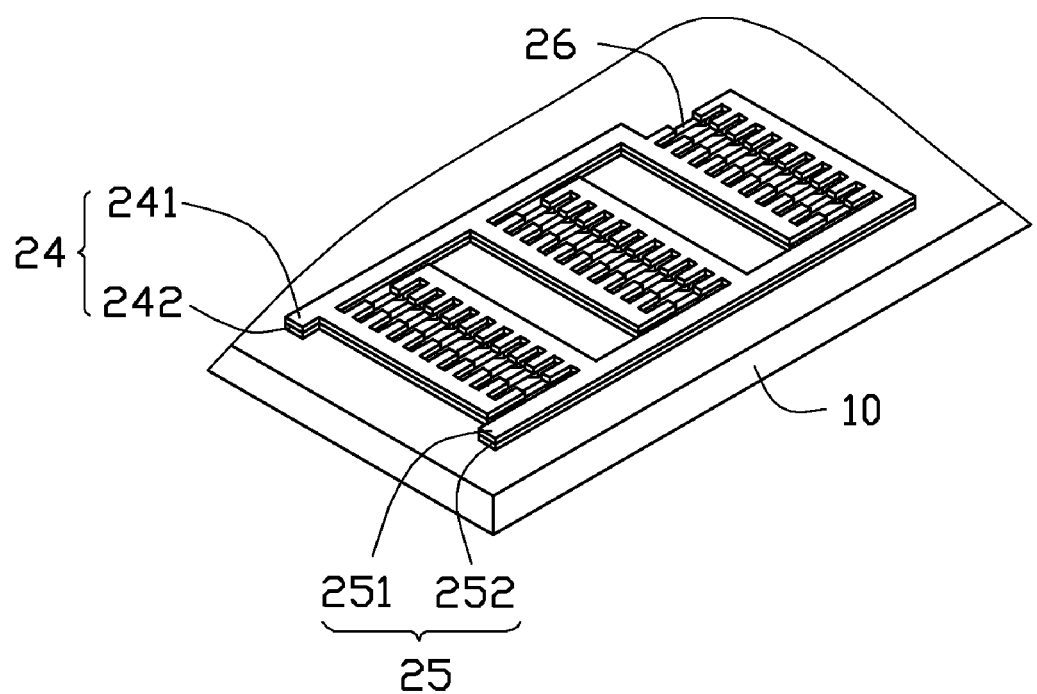
Figure 6:
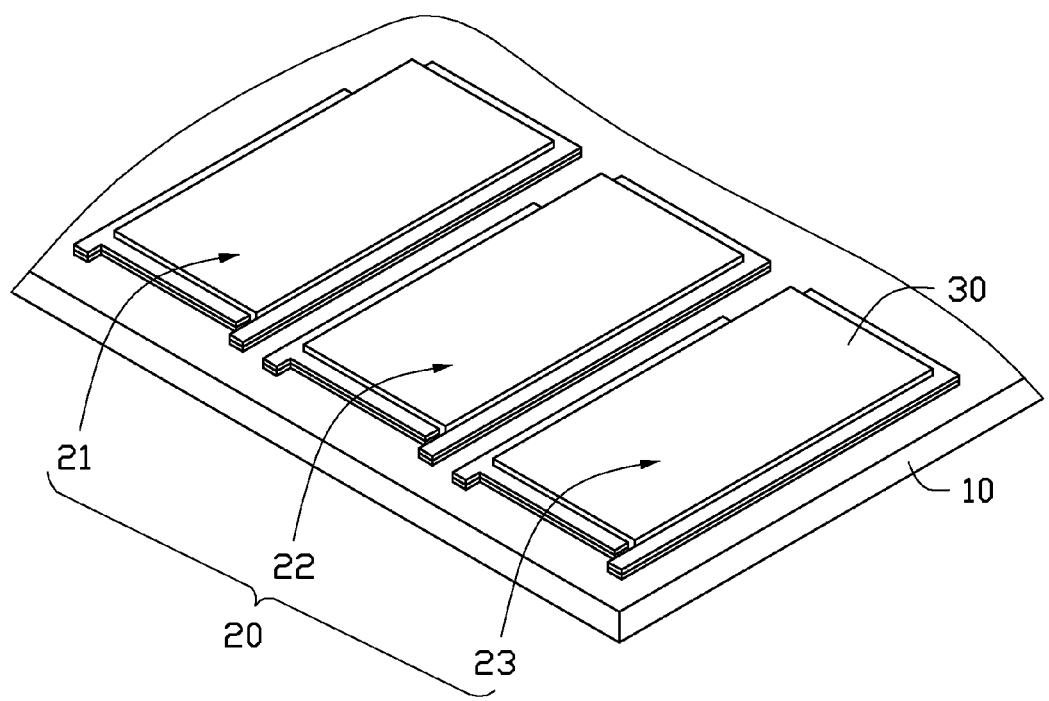

One distal end of each light emitting nanowire 26 is sandwiched between the first upper arm 241a and the first lower arm 242a, and other distal end of the each light emitting nanowire 26 is sandwiched between the second upper arm 251a and the second lower arm 252a. Thus, the light emitting nanowires 26 interconnects the first arm 240 and the corresponding second arm 250, and can be secured on the first electrode 24 and the second electrode 25. In this embodiment, each of the first lower arm 242a and the second lower arm 252a includes a pointed distal end (see FIG. 3). A longitudinal direction of the light emitting nanowire 26 is substantially parallel to an imaginary line connecting two end points of the first lower arm 242a and the second lower arm 252a.

Each cover 30 is transparent and covers over a corresponding light emitting unit. Material of the cover 30 may be epoxy. It is to be understood that in alternative embodiments, the cover 30 may be mixed with phosphor powder.

Referring to FIGS. 2 to 6, a method for making the self-illuminating display 100, according to a second embodiment, includes steps S100 through S108.

In step S100, a substrate 10 is provided. Material of the substrate 10 may be polyethylene terephthalate (PET).

In step S102, a number of first lower sub electrodes 242 and a number of second lower sub electrodes 252 are formed on predetermined regions of the substrate 10. The first lower sub electrodes 242 and the second lower sub electrodes 252 may be formed using a photolithography process. The first lower sub electrode 242 includes a number of first lower arms 242a and the second lower sub electrode 252 includes a number of second lower arm 252a (see FIG. 3). Each of the first lower arm 242a and the second lower arm 252a includes a pointed distal end.

In step S104, a number of light emitting nanowires 26 are formed on the first lower arms 242a and the second lower arms 252a. A nanowire-containing suspension containing a number of the light emitting nanowires 26 is prepared as follows: the light emitting nanowires 26 can be removed from a substrate where the light emitting nanowires 26 are grown using ultrasonic vibration. Then the light emitting nanowires 26 are collected and added to a solution to form the suspension. Different nanowire materials require different solutions as long as the polarity of the nanowire is the same as that of the solution. Therefore, the method can be adapted for using various nanowire materials to make nanowire-containing light emitting unit.

The nanowire-containing suspension is applied on the first lower sub electrode 242 and the second lower sub electrode 252. The light emitting nanowires 26 are reoriented using a dielectrophoresis method. Therefore, the light emitting nanowires 26 can be aligned on the first lower arm 242a and the second lower arm 252a. After volatilization of the solution, the light emitting nanowires 26 are left to connect electrically with the first lower arm 242a and the second lower arm 252a. Furthermore, the pointed-distal-end first lower arm 242a and the pointed-distal-end second lower arm 252a can enhance alignment of the light emitting nanowires 26.

In step S106, a number of first upper sub electrodes 241 are formed on the respective first lower sub electrodes 242 and a number of second upper sub electrodes 251 are formed on the respective second lower sub electrodes 252. The first upper sub electrode 241 includes a number of first upper arms 241a. The second upper sub electrode 251 includes a number of second upper arms 251a. One of the first upper sub electrodes 241 and a corresponding one of the first lower sub electrodes 242 cooperatively form a first electrode 24. One of the second upper sub electrodes 251 and a corresponding one of the second lower sub electrodes 252 cooperatively form a second electrode 25. One of the first upper arms 241a and the corresponding one of the first lower arms 242a cooperatively form a first arm 240, and one of the second upper arms 251a and the corresponding one of the second lower arms 252a cooperatively form a second arm 250. One distal end of each light emitting nanowire 26 is sandwiched between the first upper arm 241a and the first lower arm 242a, and the other distal end of the each light emitting nanowire 26 is sandwiched between the second upper arm 251a and the second lower arm 252a. Thus, the light emitting nanowires 26 interconnect the first arm 240 and the second arm 250 and can be secured on the first electrode 24 and the second electrode 25.

In step S108, a number of covers 30 are formed on the respective first electrodes 24 and the second electrodes 25. The material of the cover 30 is epoxy. In alternative embodiments, the cover 30 may be mixed with phosphor powder, according to a practical usage.

Figure 7:
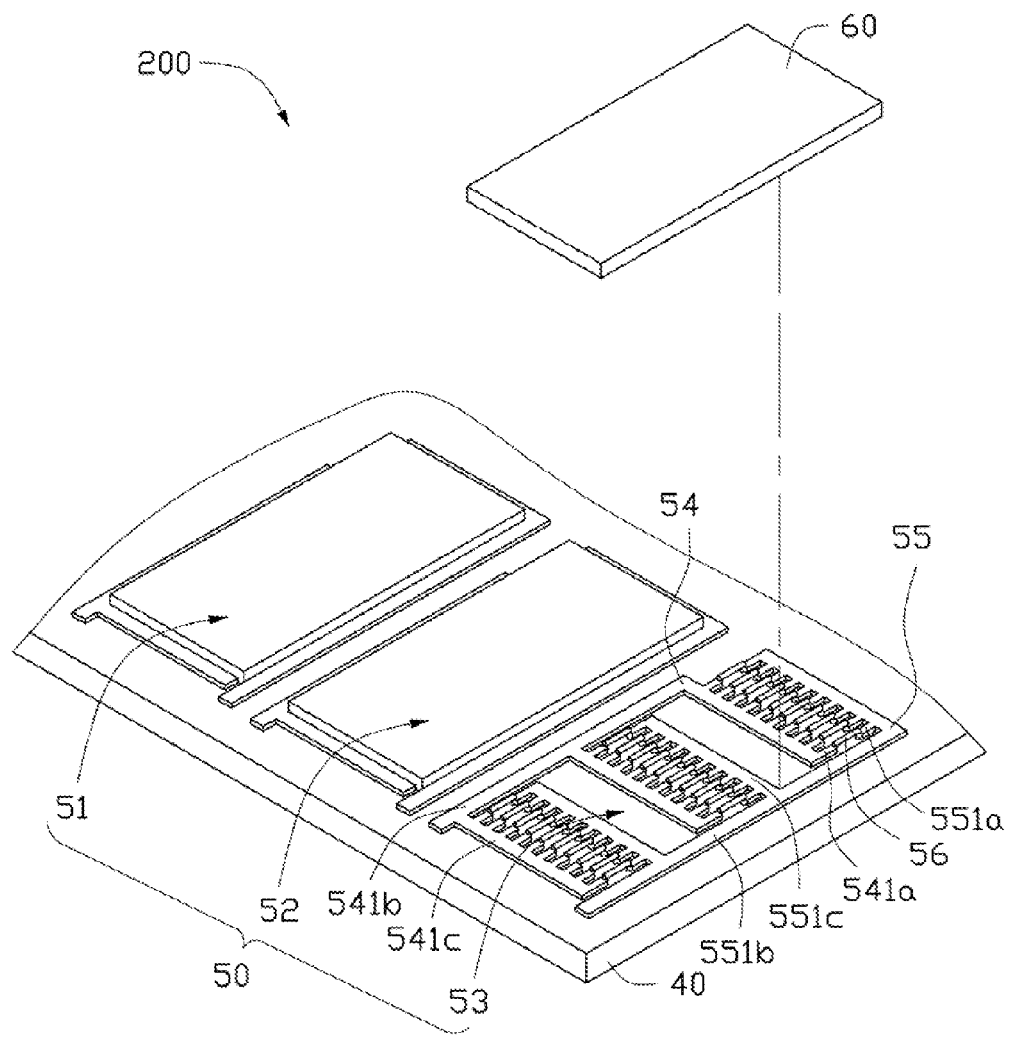
FIG. 7 is a schematic view of a self-illuminating display, according to a third embodiment.
Figure 8:
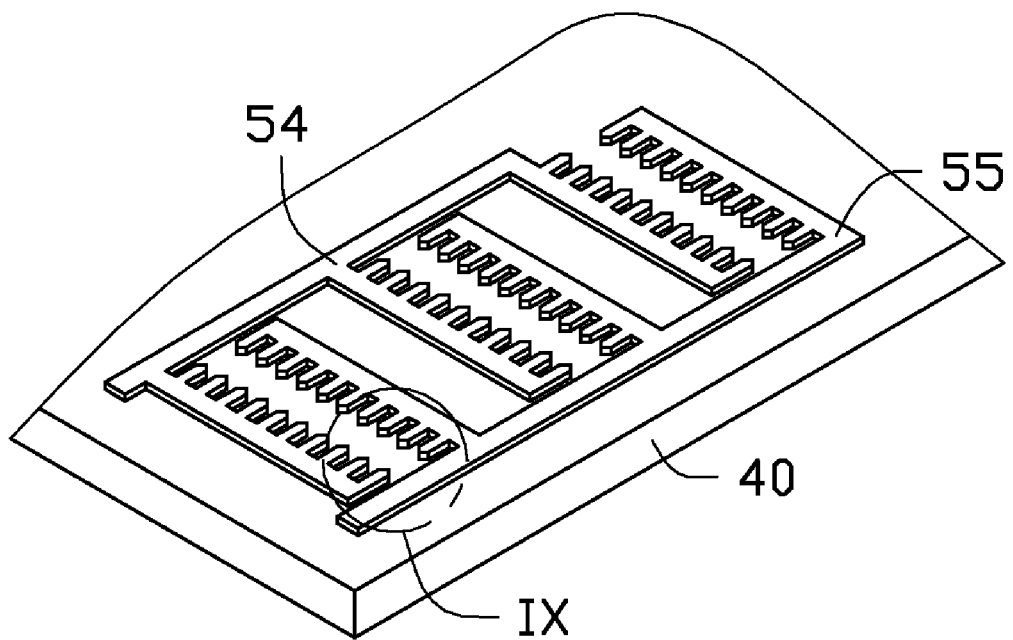
FIG. 8 to FIG. 11 are schematic views of successive stages of a method for making a self-illuminating display, according to a fourth embodiment.

Referring to FIG. 7, a self-illuminating display 200, according to a third embodiment, includes a substrate 40, a number of light emitting units 50 and a number of covers 60. The light emitting units 50 are arranged on the substrate 40 in an array fashion.

The substrate 40 is transparent and may be a polyethylene terephthalate (PET) substrate.

Each light emitting unit 50 includes three light emitting units 51, 52, and 53. The light emitting unit 51 (hereinafter the red light emitting unit 51) emits red light, the light emitting unit 52 (hereinafter the green light emitting unit 52) emits green light and the light emitting unit 53 (hereinafter the blue light emitting unit 53) emits blue light. Each light emitting unit includes a first electrode 54, a second electrode 55 and a number of semiconductor light emitting nanowires 56.

The first electrode 54 and the second electrode 55 are transparent and are arranged on the substrate 40. The first electrode 54 opposes the second electrode 55. Each semiconductor light emitting nanowire 56 has a p-n junction and interconnects the first electrode 54 and the second electrode 55. When electrified via the first electrode 54 and the second electrode 55, the light emitting nanowire 56 can emit light. In this embodiment, the nanowire 56 of the red light emitting unit 51 is comprised of GaP, the nanowire 56 of the green light emitting unit 52 is comprised of InGaAlP, and the nanowire 56 of the blue light emitting unit 53 is comprised of GaN. In alternative embodiments, each light emitting unit 50 may include one or two or more light emitting units rather than three light emitting units, depending on a practical usage, and light emitting material of the light emitting nanowire 56 may differ.

Figure 9:
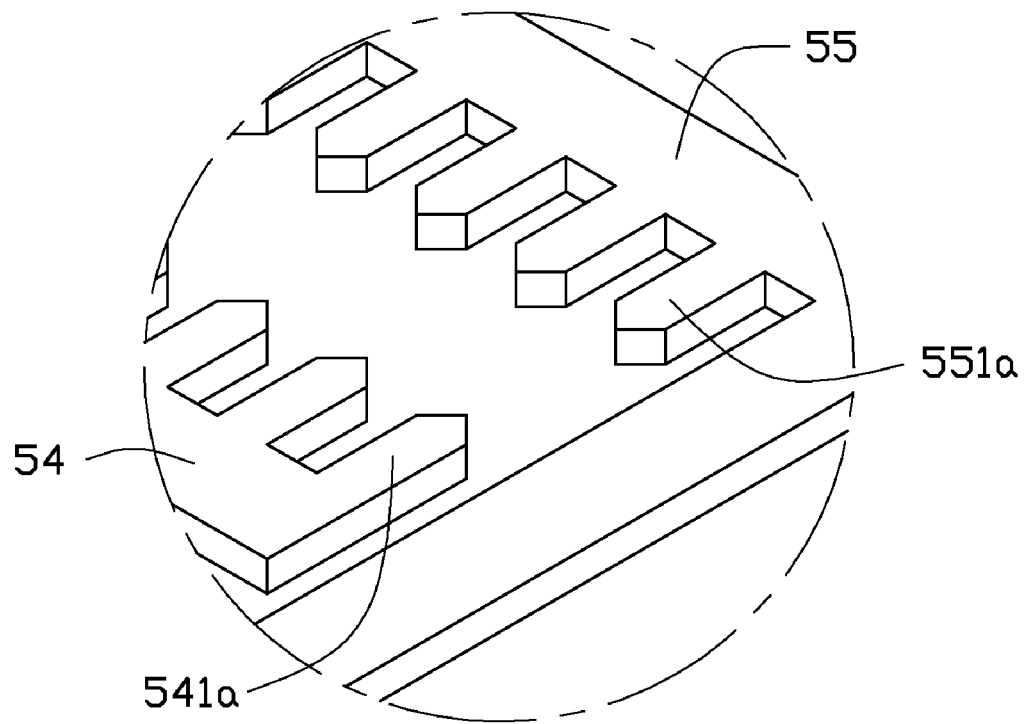
Figure 10:
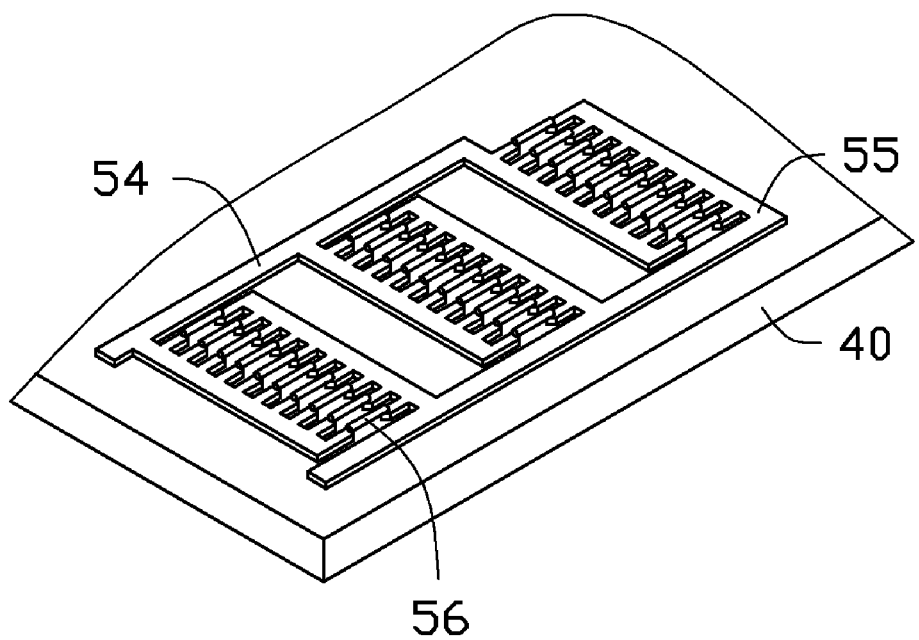
Figure 11:
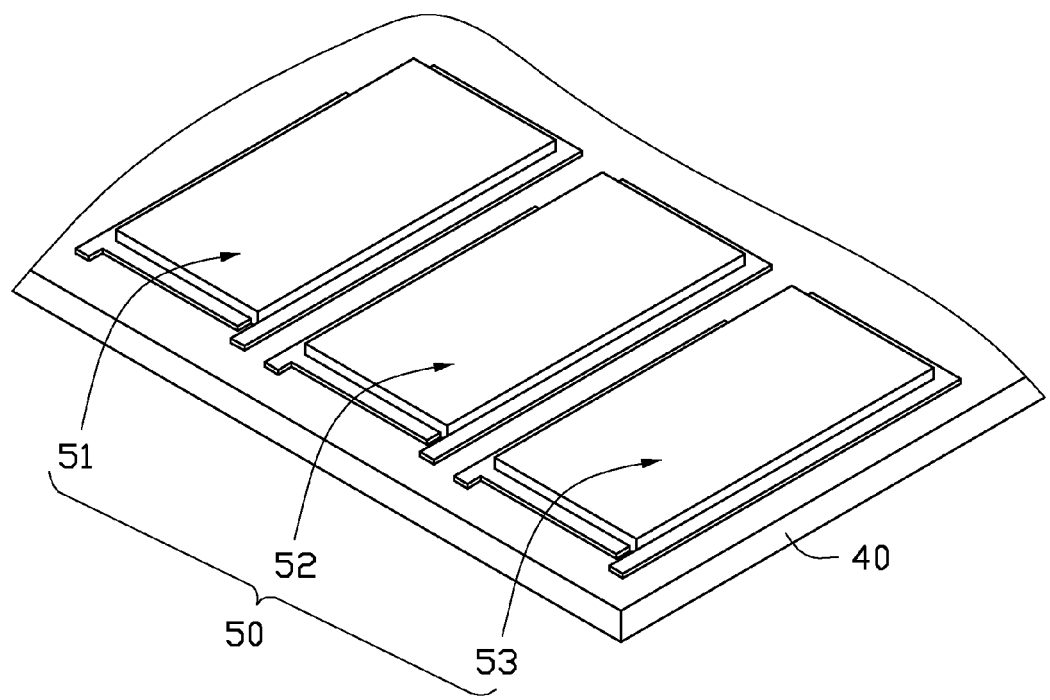

In this embodiment, the first electrode 54 includes a first horizontal beam 541b, a plurality of parallel first vertical beams 541c substantially perpendicular to the first horizontal beam 541b, and a number of parallel first arms 541a arranged along a lengthwise direction of each of the first vertical beams 541c, and each extending along a same first direction from each of the first vertical beams 541c. The second electrode 55 includes a second horizontal beam 551b, a plurality of parallel second vertical beams 551c substantially perpendicular to the second horizontal beam 551b, and a number of parallel second arms 551a arranged along a lengthwise direction of each of the second vertical beams 551c, and each extending along a same second direction from each of the second vertical beams 551c, the second direction being opposite to the first direction. Two distal ends of each light emitting nanowire 56 are connected to the first arm 541a and the second arm 551a, respectively. In this embodiment, each of the first arm 541a and the second arm 551a includes a pointed distal end (see FIG. 9). A longitudinal direction of the light emitting nanowire 56 is substantially parallel to an imaginary line connecting two end points of the first arm 541a and the second arm 551a.

Each cover 60 is transparent and covers over a corresponding light emitting unit. Material of the cover 60 may be epoxy. In alternative embodiments, the cover 60 may be mixed with phosphor powder.

Referring to FIGS. 8 to 11, a method for making the self-illuminating display 200, according to a fourth embodiment, includes steps S200 through S206.

In step S200, a substrate 40 is provided. Material of the substrate 40 may be polyethylene terephthalate (PET).

In step S202, a number of first electrodes 54 and a number of second electrodes 55 are formed on predetermined regions of the substrate 40. The first electrodes 54 and the second electrodes 55 may be formed using a photolithography process. The first electrode 54 includes a number of first arms 541a and the second electrode 55 includes a number of second arm 551a. Each of the first arm 541a opposes a corresponding second arm 551a. Each of the first arm 541a and the second arm 551a includes a pointed distal end.

In step S204, a number of light emitting nanowires 56 are formed on the first electrode 54 and the second electrode 55, each of the light emitting nanowires 56 interconnects the first arms 541a and the corresponding second arms 551a. A nanowire-containing suspension containing a number of the light emitting nanowires 56 is prepared as follows: the light emitting nanowires 56 can be removed from a substrate where the light emitting nanowires 56 are grown using ultrasonic vibrating. Then the light emitting nanowires 56 are collected and added to a solution to form the suspension. Different nanowire materials require different solutions as long as the polarity of the nanowire is the same as that of the solution. Therefore, the method can be adapted for using various nanowire materials to make nanowire-containing light emitting unit.

The nanowire-containing suspension is applied on the first electrode 54 and the second electrode 55. The light emitting nanowires 56 are reoriented using a dielectrophoresis method. Therefore, the light emitting nanowires 56 can be aligned on the first arm 541a and the second arm 551a. After volatilization of the solution, the light emitting nanowires 56 are left to connect/electrically contacting the first arm 541a and the second arm 551a. Further, the pointed-distal-end first arm 541a and the pointed-distal-end second arm 551a can enhance alignment of the light emitting nanowires 56.

In step S206, a number of covers 60 are formed on the respective first electrodes 54 and the second electrodes 55. Material of the cover 60 is epoxy. In alternative embodiments, the cover 60 may be mixed with phosphor powder, according to a practical usage.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A self-illuminating display, comprising:
   a substrate; and
   a plurality of light emitting units formed on the substrate in an array fashion, each of the light emitting units comprising a first electrode, a second electrode formed on the substrate and a plurality of light emitting nanowires,
   the first electrode comprising a first horizontal beam, a plurality of parallel first vertical beams substantially perpendicular to the first horizontal beam, and a plurality of parallel first arms arranged along a lengthwise direction of each of the first vertical beams, and each extending along a same first direction from each of the first vertical beams,
   the second electrode comprising a second horizontal beam, a plurality of parallel second vertical beams substantially perpendicular to the second horizontal beam, and a plurality of parallel second arms arranged along a lengthwise direction of each of the second vertical beams, and each extending along a same second direction from each of the second vertical beams, the second direction being opposite to the first direction,
   each of the first arms opposing a corresponding one of the second arms, each of the light emitting nanowires interconnecting one of the first arms and the corresponding one of the second arms, each of the light emitting nanowires having a p-n junction.

2. The self-illuminating display of claim 1, further comprising as plurality of covers covering over the corresponding light emitting units.

3. The self-illuminating display of claim 1, wherein the first electrode comprises a first lower sub electrode and a first upper sub electrode formed on the first lower sub electrode, the first lower sub electrode comprising a first lower slab horizontal beam, a plurality of parallel first lower sub vertical beams substantially perpendicular to the first lower sub horizontal beam, and a plurality of parallel first lower arms arranged along a lengthwise direction of each of the first lower sub vertical beams, and each extending along the same first direction from each of the first lower sub vertical beams, the first upper sub electrode comprising a first upper sub horizontal beam, a plurality of parallel first upper sub vertical beams substantially perpendicular to the first upper sub horizontal beam, and a plurality of parallel first upper arms arranged along a lengthwise direction of each of the first upper sub vertical beams, and each extending along the same second direction from each of the first upper sub vertical beams, one of the first lower arms and the corresponding one of the first upper arms cooperatively forming one of the first arms, one distal end of each of the light emitting nanowires sandwiched between the corresponding one of the first lower arms and one of the first upper arms.

4. The self-illuminating display of claim 3, wherein the second electrode comprises a second lower sub electrode and a second upper sub electrode formed on the second lower sub electrode, the second lower sub electrode comprising second lower sub horizontal beam, a plurality of parallel second lower sub vertical beams substantially perpendicular to the second lower sub horizontal beam, and a plurality of parallel second lower arms arranged along a lengthwise direction of each of the second lower sub vertical beams, and each extending alone the same first direction from each of the second lower sub vertical beams, the second upper sub electrode comprising a second upper sub horizontal beam, a plurality of parallel second upper sub vertical beams substantially perpendicular to the second upper sub horizontal beam, and a plurality of parallel second upper arms arranged along a lengthwise direction of each of the second upper sub vertical beams, and each extending along the same second direction from each of the second upper sub vertical beams, one of the second lower arms and the corresponding one of the second upper arms cooperatively forming one of the second arms, the other distal end of each of the light emitting nanowires sandwiched between the corresponding one of the second lower arms and one of the second upper arms.

5. The self-illuminating display of claim 4, wherein each of the first lower arms and the second lower arms includes a pointed distal end.

6. The self-illuminating display of claim 5, wherein a longitudinal direction of each of the light emitting nanowires is substantially parallel to an imaginary line connecting two end points of the corresponding one of the first lower arms and one of the second lower arms.

7. The self-illuminating display of claim 1, wherein the light emitting units includes red light emitting units, green light emitting units and blue light emitting units.

8. The self-illuminating display of claim 7, wherein the light emitting nanowires of the red light emitting unit are comprised of GaP, the light emitting nanowires of the green light emitting unit are comprised of InGaAlP, and the light emitting nanowires of the blue light emitting unit are comprised of GaN.

9. The self-illuminating display of claim 1, wherein two distal ends of each of the light emitting nanowires are directly formed on one of the first arms and the corresponding one of the second arms, respectively.

10. A method for making a self-illuminating display, comprising:
   forming a plurality of first electrodes and a plurality of second electrodes on a substrate, each of the first electrodes comprising a first horizontal beam, a plurality of parallel first vertical beams substantially perpendicular to the first horizontal beam, and a plurality of parallel first arms arranged along a lengthwise direction of each of the first vertical beams, each of the second electrodes comprising a second horizontal beam, a plurality of parallel second vertical beams substantially perpendicular to the second horizontal beam, and a plurality of parallel second arms arranged along a lengthwise direction of each of the second vertical beams, and each extending along a same second direction from each of the second vertical beams, the second direction being opposite to the first direction, each of the first arms opposing a corresponding one of the second arms; and
   forming a plurality of light emitting nanowires on the first electrodes and the second electrodes, each of the light emitting nanowires interconnecting one of the first arms and the corresponding one of the second arms.

11. The method of claim 10, further comprising forming a plurality of covers covering over the corresponding light emitting units.

12. The method of claim 10, wherein each of the first arms and the second arms is pointed.

13. The method of claim 12, wherein a longitudinal direction of each of the light emitting nanowires is substantially parallel to an imaginary line connecting two end points of one of the first arms and the corresponding one of the second arms.

14. The method of claim 12, wherein two distal ends of each of the light emitting nanowires are directly formed on one of the first arms and the corresponding one of the second arms, respectively.

15. The method of claim 10, wherein forming the light emitting nanowires on the first electrodes and the second electrodes comprises:
   applying a nanowire-containing suspension on the first electrodes and the second electrodes, the nanowire-containing suspension containing a plurality of the light emitting nanowires; and
   reorienting the light emitting nanowires using a dielectrophoresis method, and thereby the light emitting nanowires interconnecting the corresponding first arms and the corresponding second arms.

16. A method for making a self-illuminating display, comprising:
   forming a plurality of first lower sub electrodes and a plurality of second lower sub electrodes on a substrate, each of the first lower sub electrodes comprising a plurality of first lower arms, each of the second lower sub electrodes comprising a plurality of second lower arms, each of the first lower antis opposing a corresponding one of the second lower arms;
   forming a plurality of light emitting nanowires on the first tower sub electrode and the second lower sub electrode, each of the light emitting nanowires interconnecting one of the first lower arms and the corresponding one of the second lower arms; and
   forming a plurality of first upper sub electrodes on the respective first lower sub electrodes, and a plurality of second upper sub electrodes oil the respective second lower sub electrodes, each of the first upper sub electrodes comprising a plurality of first upper arms, each of the second upper sub electrodes comprising a plurality of second upper arms, each of the first upper arms opposing a corresponding one of the second upper arms, one distal end of each of the light emitting nanowires sandwiched between the corresponding one of the first lower arms and one of the first upper arms, the other distal end of each of the light emitting nanowires sandwiched between the corresponding one of the second lower arms and one of the second upper arms.

17. The method of claim 16, further comprising forming a plurality of covers covering the first lower arms, the first upper arms, the second lower arms, the second upper arms and the light emitting nanowires.

18. The method of claim 16, wherein each of the first lower arms and the second lower arms is pointed.

19. The method of claim 18, wherein a longitudinal direction of each of the light emitting nanowires is substantially parallel to an imaginary line connecting two end points of the corresponding one of the first lower arms and one of the second lower arms.

20. The method of claim 16, wherein forming the light emitting nanowires on the first lower sub electrodes and the second lower sub electrodes comprises:
   applying a nanowire-containing suspension on the first lower sub electrodes and the second lower sub electrodes, the nanowire-containing suspension containing a plurality of the light omitting nanowires; and
   reorienting the light emitting nanowires using a dielectrophoresis method, and thereby the light emitting nanowires interconnecting the corresponding first lower arms and the corresponding second lower arms.

* * * * *

UNITED STATES PATENT AND TRADEMARK OFFICE
CERTIFICATE OF CORRECTION

| | | |
|---|---|---|
| PATENT NO. | : 8,378,363 B2 | Page 1 of 1 |
| APPLICATION NO. | : 13/074022 | |
| DATED | : February 19, 2013 | |
| INVENTOR(S) | : Chia-Ling Hsu | |

It is certified that error appears in the above-identified patent and that said Letters Patent is hereby corrected as shown below:

On the Title Page, below Item (65) insert:

--(30)    Foreign Application Priority Data

Dec. 16 2010   (TW) ..........................99144160--

Signed and Sealed this
Eighteenth Day of March, 2014

Michelle K. Lee
*Deputy Director of the United States Patent and Trademark Office*